(12) United States Patent
Ohashi et al.

(10) Patent No.: US 8,257,842 B2
(45) Date of Patent: Sep. 4, 2012

(54) ZINC OXIDE-BASED MULTILAYER STRUCTURAL BODY AND ITS PRODUCING METHOD

(75) Inventors: Naoki Ohashi, Ibaraki (JP); Hajime Haneda, Ibaraki (JP); Haruki Ryoken, Ibaraki (JP); Isao Sakaguchi, Ibaraki (JP); Yutaka Adachi, Ibaraki (JP); Tadashi Takenaka, Ibaraki (JP)

(73) Assignee: National Institute for Materials Science, Tsukuba-shi (JP)

( * ) Notice: Subject to any disclaimer, the term of this patent is extended or adjusted under 35 U.S.C. 154(b) by 1176 days.

(21) Appl. No.: 10/569,600

(22) PCT Filed: Aug. 19, 2004

(86) PCT No.: PCT/JP2004/011884
§ 371 (c)(1),
(2), (4) Date: Nov. 13, 2006

(87) PCT Pub. No.: WO2005/022644
PCT Pub. Date: Mar. 10, 2005

(65) Prior Publication Data
US 2007/0111033 A1  May 17, 2007

(30) Foreign Application Priority Data
Aug. 27, 2003  (JP) .................. 2003-209145

(51) Int. Cl.
*B32B 19/00* (2006.01)
*B32B 9/00* (2006.01)
*B05D 1/36* (2006.01)

(52) U.S. Cl. ............... 428/701; 428/702; 427/419.2

(58) Field of Classification Search ........... 428/701, 428/702; 427/419.2
See application file for complete search history.

(56) References Cited

U.S. PATENT DOCUMENTS
5,780,149 A * 7/1998 McCurdy et al. ............ 428/336
(Continued)

FOREIGN PATENT DOCUMENTS
EP  1134811 A1  9/2001
(Continued)

OTHER PUBLICATIONS
Supplementary European Search Report dated Oct. 18, 2007, issued in corresponding European patent application No. 04771845.
(Continued)

*Primary Examiner* — Gerard Higgins
*Assistant Examiner* — Sathavaram I Reddy
(74) *Attorney, Agent, or Firm* — Westerman, Hattori, Daniels & Adrian, LLP

(57) ABSTRACT

A zinc oxide semiconductor has a zinc oxide-based laminated structure including two layers of a zinc oxide layer with a lattice volume of Va and a donor concentration of Na, and a zinc oxide or zinc oxide solid solution layer with a lattice volume of Vb and a donor concentration of Nb. The relationships of Va<Vb and Na>Nb are satisfied. The layer with the lattice volume Va serves as a charge-supplying layer and the layer with the lattice volume Vb serves as a charge-receiving layer in the laminated structure. The charge is transferred from the layer serving as the charge-supplying layer to the layer serving as the charge-receiving layer even when no external electric field is applied to the laminated structure. A charge depletion layer is formed in the charge-supplying layer due to charge transfer from the charge-supplying layer to the charge-receiving layer.

3 Claims, 3 Drawing Sheets

U.S. PATENT DOCUMENTS

2003/0186088 A1* 10/2003 Kato et al. .................... 428/698

FOREIGN PATENT DOCUMENTS

| EP | 1172858 | * | 1/2002 |
|---|---|---|---|
| EP | 1172858 A1 | | 1/2002 |
| EP | 1335044 A1 | | 8/2003 |
| EP | 1349217 A1 | | 10/2003 |
| JP | 05-070286 | | 3/1993 |
| JP | 07-242496 | | 9/1995 |
| JP | 2001-048698 | | 2/2001 |
| JP | 2001-48698 A | | 2/2001 |
| JP | 2002-170993 A | | 6/2002 |
| JP | 2003-041362 | | 2/2003 |
| JP | 2003-41362 A | | 2/2003 |
| JP | 2003-046081 | * | 2/2003 |

OTHER PUBLICATIONS

The Ceramic Society of Japan Nenkai Koen Yokoshu, vol. 2002, 2C33, (nichi) Mar. 24, 2002, p. 177.

International Search Report of International Application PCT/JP2004/011884 mailed Nov. 30, 2004.

The Ceramic Society of Japan "Fabrication and evaluation of MgxZn1-x 0 thin films which added Al by the PLD method" Annual Meeting Manuscripts, 2C33, 2002 Abstract.

R. Dingle et al., "Electron mobilities in modulation-doped semiconductor heterojunction superlattices", Applied Physics Letter, vol. 33 No. 7, Oct. 1, 1978, p. 665-667.

T. Ohgaki et al., "Growth condition dependence of morphology and electric properties of ZnO films on sapphire substrates prepared by molecular beam epitaxy", Journal of Applied Physics, vol. 93 No. 4, Feb. 15, 2003, p. 1961-1965.

T. Ogino et al., "Microstructure of Zinc Oxide Grown by rf Magnetron Sputtering: Aspect of Oxygen Vacancy", Key Engineering Materials, vol. 181-182, 2000, p. 101-104.

The Ceramic Society of Japan "Structure and electric characterization of MgxZn1-x O thin films which added Al by the PLD method" $15^{th}$ Autumn Symposium, " " ,2J15.

A. Ohtomo et al., "$Mg_xZn_{1-x}O$ as a II-VI widegap semiconductor alloy", Applied Physics Letters, vol. 72, No. 19, May 11, 1998, p. 2466-2468.

N. Ohashi et al., "Crystallinity of $In_2O_3(ZnO)_5$ films by epotaxial growth with a self-buffer-layer", Journal of Applied Physics, vol. 92 No. 5, Sep. 1, 2002, p. 2378-2384.

G.H. Jensen et al., "Absorption Edge and Urbach's Rule in ZnO", Phys. Stat. Sol. (b), vol. 60, 1973, p. 169-173.

N. Ohashi et al., "Passivation of active recombination centers in ZnO by hydrogen doping", Journal of Applied Physics, vol. 93 No. 10, May 15, 2003, p. 6386-6392.

* cited by examiner

ZINC OXIDE-BASED MULTILAYER STRUCTURAL BODY AND ITS PRODUCING METHOD

TECHNICAL FIELD

The present invention relates to a zinc oxide semiconductor, and in particular, to a zinc oxide laminated structure useful in optical, electric and electronic industries and exhibiting a charge separation state by Laminating a charge-receiving layer and a charge-supplying layer, and a method for manufacturing the same.

BACKGROUND ART

Field effect transistors are known to have a structure of an electronic element taking advantage of a charge separation phenomenon of a zinc oxide laminate (for example, patent document 1). These semiconductors serve as elements having a switching function by taking advantage of changes of the charge separation states generated by applying an electric field. Such electronic elements are used for switching of display devices. Electrons are attracted into an area called a channel in a field effect transistor by applying an electric field to the element through an electrode called a gate. The transistor is used in an ON-state by permitting a channel portion to be a high electron density area, and it is used in an OFF-state when electrons are not attracted. On the contrary, it is possible to provide the OFF-state by sweeping the electrons in the channel area by applying a voltage on the gate.

Different from the field effect transistor described above, a modulated doping method is known for permitting charge separation to occur by allowing semiconductors to contact one another while no electric field is applied (for example, non-patent document 1). Charge transfer from a semiconductor having a high electron density to a semiconductor having high electron mobility is induced by laminating a semiconductor having a wide band gap and high electron density with a semiconductor having a narrow band gap and high electron mobility. Consequently, a semiconductor material that satisfies both the high electron density and high electron mobility is formed by allowing electrons to move through a layer having high mobility.

The transistor having high electron mobility is an electronic element obtainable by joining semiconductor materials having different band gaps and electron densities one another, wherein electrons are injected from a carrier-supplying layer having an intrinsically high electron density to a carrier-transfer layer having an intrinsically low electron density. Control of the band gap and control of the electron density are required for obtaining such an electronic element. The high electron-mobility transistor is obtained by laminating zinc oxide semiconductors having different magnesium concentrations one another as described in patent document 1.

The zinc oxide transistor used for the electronic element is a thin film crystal of zinc oxide usually manufactured by a thin film process such as a sputtering method, CVD method, pulse laser vapor deposition method and molecular beam epitaxial method (for example, non-patent document 2 and non-patent document 3). The thin film crystal of zinc oxide obtained by a thin film synthesis method is particularly grown in a high non-equilibrium environment, which is different from a chemical vapor transfer method shown in non-patent document 2 and a hydrothermal synthesis method shown in patent document 3.

Accordingly, as described in non-patent document 2, growth temperatures and oxygen partial pressures serve as parameters for growing the thin film crystal in a growth vessel for allowing the crystal to grow, and lattice parameters and electron densities of the thin film crystal change in a complicated manner by these parameters. In other words, different from zinc oxide manufactured in an environment at a high temperature under a relatively equilibrium state, electronic characteristics and optical characteristics of the zinc oxide semiconductor material obtained are not uniquely determined simply by its chemical composition in the zinc oxide semiconductor manufactured under a non-equilibrium condition.

However, no instructions considering the production under such non-equilibrium state are given on the structure of the electronic element in the invention shown in patent document 1 with respect to selection of the zinc oxide semiconductor material. In addition, development of an effective technology is required for the production method of the zinc oxide-based electronic element by taking the non-equilibrium state into consideration.

A thin film material concomitantly realizing a high charge density and high charge mobility as a result of charge transfer has been provided in a gallium arsenide-based thin film substrate formed by alternately laminating the charge transfer layer and charge-supplying layer as shown in non-patent document 1. On the other hand, it has been considered to endow the zinc oxide thin film with high conductivity by giving a charge separation state as shown in non-patent document 4.

While a super-lattice structure is formed by alternately depositing a thin film layer of a zinc oxide solid solution doped with magnesium and aluminum, and a thin film layer of pure zinc oxide as described in non-patent document 4, no improvement of electron mobility is attained as expected by realizing charge transfer. This is because the lattice constant varies in a complex manner when a solid solution in which both magnesium and aluminum are dissolved in zinc oxide is formed as described below.

Patent document 1 shows an art for changing the band gap of zinc oxide by adding magnesium. Actually, a decrease of the lattice constant as a result of simply adding magnesium is recognized in the solid solution of zinc oxide $(Zn, Mg)O$. In non-patent document 4, it is attempted to form zinc oxide with high mobility by taking advantage of the change of the lattice constant, and to reduce the lattice constant by substituting zinc with a cation having a smaller ionic radius than zinc such as magnesium, while the thin film of the zinc oxide solid solution, in which zinc is substituted with a donor-forming cation such as aluminum, is intended to be used as a layer for supplying electrons.

However, this attempt failed as described in non-patent document 4. This means that the zinc oxide laminated structure in which charge separation state is realized as an object of the present invention is not obtained in a construction comprising the charge-supplying layer and charge-receiving layer and in the absence of an electric field applied between the charge-supplying layer and charge-receiving layer, by a simple instruction that magnesium is only added as an element for changing the lattice constant and for forming a donor.

Non-patent document 5 shows that, since the band gap of zinc oxide is changed by adding magnesium. This effect causes formation of a multiple quantum well structure to permit luminous efficiency of excitons to be enhanced. However, according to non-patent document 5, while a laminated structure of two kinds of zinc oxide having different band gaps one another is obtained, the charge density in the thin film is not controlled, and a charge separation state as an object of the present invention has not been attained.

A spontaneous super-lattice structure is obtained by adding indium to zinc as described in non-patent document 6 or in patent document 4. This super-lattice structure has a structure that may be assumed to be a laminated structure of an indium oxide layer and a zinc oxide layer, and is represented by a chemical formula $In_2O_3(ZnO)_m$ where m is an integer.

While this laminated structure has a super-lattice structure based on the crystal structure of zinc oxide, any periodically introduced $In_2O_3$ layers function as neither a carrier-supplying layer nor a carrier-accepting layer, and an insulating material is obtained when high crystallinity and low defect concentration are realized. Accordingly, the super-lattice structures shown in these literatures cited above are not considered to be the zinc oxide-based laminated structure having the charge separation state as the object of the present invention.

Non-patent document 1: R. Dinger, H. L. Stormer, A. C. Gossarland and W. Wiegmann, Applied Physics Letters, vol. 33, p 665, 1978

Non-patent document 2: Ohgaki, T., Ohashi, N., Kakemoto, H., Sawada, S., Adachi, Y., Haneda, H. and Tsurumi, T., Journal of Applied Physics, vol. 93, No. 4, p 1961-1965, 2003

Non-patent document 3: Ogino, T., Komatsu, M., Sakaguchi, I., Hishita, S., Ohnishi, N., Takenaka, T., Okiku, Kawamoto, N. and Haneda, H., Key Engineering Materials, vol. 181-1, p 101-104, 2000

Non-patent document 4: 15th Autumn Symposium, Japan Ceramic Association, Lecture No. 2J15

Non-patent document 5: Ohmoto, A., Kawasaki, Y., Koida, T., Masubuchi, K., Koinuma, H., Sakurai, Y., Toshida, Y., Yasuda, T. and Segawa, Y., Applied Physics Letters, vol. 72, No. 19, p 2466-2468, 1998

Non-patent document 6: Ohashi, N., Sakaguchi, I., Hishita, S., Adachi, Y., Haneda, H. and Ogino, T., Journal of Applied Physics, vol. 92, No. 5, 2378-2384, 2002

Non-patent document 7: G. H. Jenden and T. Skettrup, Phys. Status, Sold (b), vol. 60, p 169, 1973

Non-patent document 8: N, Ohashi, T. Ishigaki, N. Okada, H. Taguchi, I. Sakaguchi, S. Hishita, T. Sekiguchi and H. Haneda, Journal of Applied Physics, Vo. 93, p 6386, 2003

Patent document 1: Japanese Unexamined Patent Application Publication No. 2003-046081

Patent document 2: Japanese Unexamined Patent Application Publication No. 5-70286

Patent document 3: Japanese Unexamined Patent Application Publication No. 7-242496

Patent document 4: Japanese Unexamined Patent Application Publication No. 2003-041362

DISCLOSURE OF INVENTION

Problems to be Solved by the Invention

It is effective for utilizing the zinc oxide as electronic elements to permit charge separation to occur by compositing zinc oxide crystals having different states. It is necessary for generating charge separation to generate a potential gradient in the zinc oxide material by contact of zinc oxide semiconductors having different band gaps, or by contact of semiconductors having different Fermi levels, in order to control the behavior of electrons and positive holes in the semiconductor by the potential gradient.

Accordingly, an object of the present invention is to induce charge separation by allowing zinc oxide layers having different band gaps and charge densities in respective layers to contact one another. It is desirable for utilizing the zinc oxide-based laminated structure according to the present invention as electronic elements to permit the electrons to rapidly move in the charge-receiving layer after charge transfer into the zinc oxide crystal, and to enhance mobility of the electrons in the charge-receiving layer.

However, it is necessary for controlling the charge separation state to control the band gap and Fermi level, and characteristic parameters of such material should be controlled in a non-equilibrium state for controlling the material in the non-equilibrium state.

Accordingly, the problem to be solved by the present invention is to realize a state in which charge separation occurs in the laminated thin film of zinc oxide by taking the non-equilibrium state into consideration, or a state in which electrons are transferred from the charge-supplying layer to the charge-receiving layer, in a manufacturing process under a non-equilibrium state of the thin film manufacturing process. Another problem is to establish a method for manufacturing the zinc oxide-based laminated structure in which charge separation has occurred.

In the aforementioned gallium arsenide-based super-lattice structure, the charge-supplying layer is formed by injecting donors into aluminum-doped gallium arsenide having a relatively large band gap, and the charge-receiving layer is formed with pure gallium arsenide having a relatively small band gap. For obtaining this charge separation state in zinc oxide, the laminated structure should be formed by forming the charge-supplying layer by adding the donor in a relatively high concentration into zinc oxide having a relatively large band gap, and by forming the charge-receiving layer by adding the donor in a relatively low concentration into zinc oxide having a relatively small band gap. In a thin film forming process, the non-equilibrium state in the process should be controlled in order to manufacture a thin film in which charge transfer occurs form the charge-supplying layer to the charge-receiving layer as desired.

Means for Solving the Problem

As described in non-patent document 1, the band gap should be controlled for forming a structure in which the charge is transferred to the charge-receiving layer having a relatively narrow band gap and relatively low charge density, by adding the donor to the charge-supplying layer having a relatively wide band gap. While zinc oxide doped with magnesium and aluminum serves as the charge-supplying layer and pure zinc oxide serves as the charge-receiving layer as described in non-patent document 4, it has been shown that charge separation does not occur by simply adding magnesium. Therefore, charge separation cannot be realized by the technical idea described in non-patent document 4 that discloses to simply add magnesium.

Accordingly, the problem for reliably realizing the charge separation state is solved in the present invention not only by simply controlling additives such as magnesium, but also by controlling the lattice constant of the zinc oxide-based laminate thus obtained.

As disclosed in non-patent document 7, it is known that the magnitude of the band gap of zinc oxide shows temperature dependency and the band gap is reduced by increasing the temperature of the crystal. This may be interpreted that the band gap is narrowed by increasing the lattice constant due to thermal expansion. Accordingly, control of the band gap may be possible for realizing the charge transfer state by taking advantage of zinc oxide having a modified lattice constant.

According to non-patent document 5 above, the lattice constant of zinc oxide containing no donors is reduced by substituting zinc with a cation having a relatively small ionic radius such as magnesium based on the technical idea as described above, and a solid solution of zinc oxide having a wide band gap has been formed. However, only the band gap is controlled without controlling the donor concentration according to the technical scope disclosed in non-patent document 5 above, and the art for controlling electric conductivity by generating charge separation between the charge-supplying layer and charge-receiving layer as shown in non-patent document 1 has not been attained.

Accordingly, the zinc oxide-based laminated structure comprising the charge-supplying layer and charge-receiving layer as an object of the present invention comprises a zinc oxide-based compound that may serve as a charge-supplying layer with a relatively small lattice constant and a relatively high charge concentration, and a zinc oxide laminated structure comprising a laminate of the zinc oxide-based compound having a relatively large lattice constant and a relatively low charge concentration. It is a quite crucial problem for obtaining a zinc oxide-based laminated structure exhibiting charge separation to obtain a structure in which the charge transferred to the charge-receiving layer from the charge-supplying layer as a result of charge separation remains in the charge-receiving layer, and does not flow back to the charge-supplying layer.

According to non-patent document 1, charge separation has been attained in the gallium arsenide-based laminated structure. In the structure, a charge depletion layer is formed between the charge-supplying layer and charge-receiving layer due to charge transfer. Back flow of the charge from the charge-receiving layer to the charge-supplying layer is suppressed by this charge depletion layer and an interface barrier. Therefore, the interface barrier is formed by generating the charge depletion layer at the charge-supplying layer side of the interface between the charge-supplying layer and charge-receiving layer of the zinc oxide for reliably causing charge separation in the zinc oxide-based laminated structure as described in non-patent document 1.

The lattice constant is controlled by adding magnesium as described above. It has been known that the lattice constant reduces by adding magnesium, and this reduction of the lattice constant causes an expansion of the band gap. When any one of aluminum, indium, gallium and hydrogen, or a plurality of them is added to zinc oxide, the electron concentration in zinc oxide is known to be increased.

Accordingly, magnesium is added to the charge-supplying layer while a donor is added in a higher concentration relative to the charge receiving layer in the zinc oxide-based laminated structure according to the present invention. However, since the lattice constant of the charge-supplying layer is not always reduced relative to the lattice constant of the charge-receiving layer merely by adding these additives due to zinc oxide's own non-equilibrium, the laminated structure of the zinc oxide-based compound of the present invention is featured in that the lattice constant of the zinc oxide-based compound as a charge-supplying layer is smaller than the lattice constant of the zinc oxide-based compound that serves as the charge-receiving layer after adding these additives.

Forming a high mobility transistor and modulated doping are possible in the zinc oxide-based laminated structure according to the present invention by allowing electrons in the high electron density layer of the charge-receiving layer formed by charge transfer to function as conduction electrons. Since the conduction electrons run through the charge-receiving layer, the charge-receiving layer is desirably a layer having high electron mobility. Therefore, a zinc oxide laminated structure being able to avoid mobility from decreasing by grain boundary scattering may be manufactured in the present invention by forming a zinc oxide-based laminated structure having a zinc oxide single crystal as the charge-receiving layer.

It is necessary in the manufacturing process for forming the zinc oxide-based laminated structure that the charge-supplying layer and charge-receiving layer have a relatively small lattice constant and relatively large lattice constant, respectively. For realizing this state in a non-equilibrium manufacturing process, the laminated structure should be manufactured by suppressing non-equilibrium defects from being formed.

Accordingly, the zinc oxide-based compound having a lattice constant small enough as the charge-supplying layer is manufactured at a high temperature enough for reducing the lattice constant relative to that of the zinc oxide-based compound that serves as the charge-receiving layer, in order to avoid generation of the charge separation state from being inhibited by the change of the lattice constant due to non-equilibrium defects. Otherwise, the non-equilibrium state is relaxed for realizing a desired manufacturing condition by applying a heat treatment after forming the zinc oxide-based laminated structure in a non-equilibrium state.

BEST MODE FOR CARRYING OUT THE INVENTION

The present invention provides a zinc oxide-based laminated structure comprising two layers of a zinc oxide or zinc oxide solid solution layer with a lattice volume of Va and a donor concentration of Na, and a zinc oxide or zinc oxide solid solution layer with a lattice volume of Vb and a donor concentration of Nb, wherein the relationships of Va<Vb and Na>Nb are satisfied between both layers of the laminated structures; and the layer with the lattice volume Va serves as a charge-supplying layer and the layer with the lattice volume Vb serves as a charge-receiving layer in the laminated structure. The charge is transferred from the layer serving as the charge-supplying layer to the layer serving as the charge-receiving layer even when no external electric field is applied to the laminated structure; and a charge depletion layer is formed in the charge-supplying layer due to charge transfer from the charge-supplying layer to the charge-receiving layer.

The zinc oxide solid solution having the lattice volume Va has a larger band gap than zinc oxide having the lattice volume Vb. Zinc oxide having the lattice volume Vb may be either pure zinc oxide or a solid solution in which the lattice volume is made to change by adding additives, and it is essential that the relationship of Va<Vb is satisfied in the lattice volume. The layer in which a Fermi level is allowed to come in the vicinity of a conductive band by adding a donor to the zinc oxide solid solution having the lattice volume Va is the zinc oxide-based compound that serves as the charge-supplying layer.

The Fermi level may be located either in a band gap or within a conductive layer, provided that charge transfer occurs from the layer that serves as the charge-supplying layer to the layer serves as the charge-receiving layer even in the absence of an external electric field applied to the laminated stricture, and the charge depletion layer is formed in the charge-supplying layer due to charge transfer from the charge-supplying layer to the charge-receiving layer. However, the relationship of Va<Vb should be satisfied even by adding the donor.

On the other hand, another layer constituting the zinc oxide-based laminated structure according to the present invention has the lattice volume Vb that satisfies the relationship of Va<Vb, and is a zinc oxide-based compound containing no doped donor. Consequently, the layer with the lattice volume Vb has a relatively smaller band gap as compared with the zinc oxide-based compound having the lattice volume Va, so that the Fermi level is remote from the conduction band and comes at the center of the band gap. Charge transfer occurs by joining the two layers so as to allow the Fermi levels in the charge-supplying layer and charge-receiving layer to match, and electrons corresponding to the charge in the depletion layer are accumulated in the charge-receiving layer side.

It should be noted that no charge depletion layer is formed in the charge-supplying layer even after charge separation, when excess donors are added to the charge-supplying layer or the difference between the lattice volume of the charge-supplying layer and the lattice volume of the charge-receiving layer is small. Since the present invention fundamentally relates to the zinc oxide-based laminated structure in the charge separation state and in the state in which the charge depletion layer is formed at the charge-supplying layer side of the interface between the charge-supplying layer and charge-receiving layer, a state having no charge depletion layer observed in the case when the an excess donor is added to the charge-supplying layer or when the difference between Va and Vb is insufficient is not included in the examples of the present invention.

The electron state of the zinc oxide-based laminated structure according to the present invention is as shown in FIG. 1. Forming the charge depletion layer causes charge transfer due to an applied voltage when applied voltage dependency of the electrostatic capacity is measured by applying the voltage in the direction of lamination of the laminated structure; thereby the electrostatic capacity changes in response to the voltage due to a change of the thickness of the charge depletion layer. The height of a potential barrier formed between the charge-supplying layer and charge-receiving layer is desirably three times or more of a thermal energy (a product of Boltzmann constant and temperature) at an operation temperature of the element. When this condition is not satisfied, the probability for thermally excited electrons to cross over a potential barrier is enhanced to possibly interfere with the action as an element.

Non-linear current-voltage characteristics may be observed due to the presence of the potential barrier formed at the interface between the charge-supplying layer and charge-receiving layer, when the current-voltage characteristics are measured by applying the voltage in the direction of lamination. As shown in FIG. 2, the super lattice structure formed by periodically laminating the laminated structure is zinc oxide formed by modulated doping, and can be used as a material that exhibits high electron mobility. A field effect transistor may be formed by using the charge-receiving layer as a channel.

The present invention also provides a zinc oxide-based laminated structure comprising two layers of a zinc oxide solid solution layer with a magnesium concentration of Ma, donor concentration of Na and lattice volume of Va, and a zinc oxide or zinc oxide solid solution layer with a magnesium concentration of Mb, a donor concentration of Nb and lattice volume of Vb, wherein the relationships of Ma>Mb and Na>Nb are satisfied between both layers of the laminated structure; and the lattice volume Va of the layer having the magnesium concentration of Ma is smaller than the lattice volume Vb having the magnesium concentration of Mb. The charge is transferred from the layer serving as the charge-supplying layer to the layer serving as the charge-receiving layer even when no external electric field is applied to the laminated structure; and a charge depletion layer is formed in the charge-supplying layer due to charge transfer from the charge-supplying layer to the charge-receiving layer.

Adding magnesium permits the lattice constant of the zinc oxide to be changed, and the effect of adding magnesium is that the lattice constant of zinc oxide is reduced to thereby increase the band gap of zinc oxide. In other words, the charge supplying layer and the charge-receiving layer should be a layer in which the band gap is expanded with a smaller lattice volume Va and a layer in which the band gap is reduced with a larger lattice volume Vb, respectively. Therefore, it is effective to use a substance having a reduced lattice constant as the zinc oxide-based compound that serves as the charge-supplying layer. When a zinc oxide solid solution layer doped with magnesium is manufactured under a non-equilibrium condition, the lattice constant thereof happens to be larger than that of pure zinc oxide as a result of forming oxygen defects or other non-stoichiometry of the lattice.

Since the oxygen defect and other stoichiometry causes a donor level to be formed, it may not be impossible to take advantage of the defect as a donor for supplying the charge by manufacturing non-stoichiometric zinc oxide when the charge supplying layer is formed. However, the effect for increasing the band gap by inducing the decrease of the lattice constant according to the present invention is impaired by introducing the donor that causes non-stoichiometry, and it may be probable the desired charge separation is not attained.

Therefore, it is essential to confirm that the zinc oxide-based laminated structure is characterized by smaller lattice volume Va of the charge-receiving layer than the lattice volume Vb of the charge-receiving layer by monitoring the lattice constant, even when zinc oxide having the charge-supplying layer doped with magnesium is used.

The present invention provides a zinc oxide-based laminated structure comprising two layers of a zinc oxide solid solution layer with a lattice volume of Va and a donor concentration of Na, and a zinc oxide or zinc oxide solid solution layer with a lattice volume of Vb and a donor concentration of Nb, wherein the relationships of Va<Vb and Na>Nb are satisfied between both layers of the laminated structures; and the layer with the lattice volume Va comprises dissolved magnesium and any one of aluminum, gallium, indium and hydrogen, or a plurality of additives as a combination of the above elements. The charge is transferred from the layer serving as the charge-supplying layer to the layer serving as the charge-receiving layer even when no external electric field is applied to the laminated structure; and a charge depletion layer is formed in the charge-supplying layer due to charge transfer from the charge-supplying layer to the charge-receiving layer.

Adding any one of aluminum, gallium, indium and hydrogen, or a plurality of additives selected from the elements above in the layer serving as the charge-supplying layer permits the electron density in the charge-supplying layer to be controlled or is effective for controlling the electron density. Since aluminum, indium and gallium are IIIb elements having a tendency to be 3-valent ions, they function as donors in zinc oxide by substituting zinc. As described in non-patent document 8, these elements are present as interstitial elements at inter-lattice sites, and function as donors in zinc oxide. Electrons for inducing charge separation can be introduced in the zinc oxide-based laminated structure by adding impurities that serve as donors in the charge-supplying layer.

The lattice constant of zinc oxide may be increased as described below by adding additives in zinc oxide. When magnesium having a smaller ionic radius than zinc is added, the lattice constant of zinc oxide is expected to be reduced.

While it is actually known that the lattice constant is reduced in an equilibrium state, it should be noted that the lattice constant may be rather increased by adding magnesium when magnesium is combined with aluminum.

FIG. 3 shows the length of c-axis of the lattice constant of the zinc oxide crystal in the zinc oxide thin film doped with 0.5 at % of aluminum formed on a sapphire single crystal substrate using a conventionally used pulse laser vapor deposition apparatus. As shown in FIG. 3, the lattice constant of the thin film obtained differs by changing the temperature of the substrate for depositing the thin film. In particular, the lattice constant is increased by depositing at a relatively low temperature.

When the zinc oxide thin film is synthesized by adding aluminum and magnesium in order to utilize the thin film as the charge-supplying layer of the zinc oxide-based laminated structure, it is essential that the lattice volume Va of the layer doped with aluminum is smaller than the lattice volume Vb of the charge-receiving layer. In other words, the band gap of the charge-supplying layer should be larger than the band gap of the charge-receiving layer.

The tendency for increasing the lattice constant by adding aluminum shown in FIG. 3 is also observed in the zinc oxide solid solution concomitantly doped with magnesium and aluminum. Characteristics that the band gap of the charge-supplying layer is larger than the band gap of the charge-receiving layer should be always satisfied when the charge-supplying layer is formed by concomitantly adding magnesium and impurities for forming the donor.

Since the band gap is controlled by controlling the lattice constant in the present invention, a structure in which the lattice volume of the charge-supplying layer should is smaller than the lattice volume Vb of the charge-receiving layer should be always attained by noticing the change of the lattice constant as a result of changes of the manufacturing temperature as shown in FIG. 3.

A zinc oxide solid solution layer having an increased lattice constant even by adding aluminum and magnesium does not actually function as the charge-supplying layer as shown in Comparative Example 1 even when a laminated structure is formed. Accordingly, the laminated structure comprising the charge-supplying layer and charge-receiving layer is required to follow the prescription of the present invention by monitoring the lattice constant.

The present invention also provides a zinc oxide laminated structure comprising two layers of a zinc oxide or a zinc oxide solid solution layer with a lattice constant of Va and donor concentration of Na, and a zinc oxide or zinc oxide solid solution layer with a lattice volume of Vb and donor concentration of Nb, wherein the relationships of Va<Vb and Na>Nb are satisfied between both layers of the laminated structures; and the layer with the lattice volume of Va serves as a charge-supplying layer while the layer with the lattice volume of Vb serves as a charge-receiving layer. The charge is transferred from the layer serving as the charge-supplying layer to the layer serving as the charge-receiving layer even when no external electric field is applied to the laminated structure; and a charge depletion layer is formed in the charge-supplying layer due to charge transfer from the charge-supplying layer to the charge-receiving layer.

It should be particularly noted in the laminated structure exhibiting a charge separation state that a charge transfer state from the layer that serves as the charge-supplying layer to the layer that serves as the charge-receiving layer is attained even by applying no external electric field, and that a charge depletion layer is formed in the charge-supplying layer due to charge transfer from the charge-supplying layer to the charge-receiving layer.

The zinc oxide solid solution becomes a degenerated semiconductor by doping an excess concentration of a donor in the charge-supplying layer to cause the solid solution to exhibit a metallic behavior. Then, the junction between the charge-supplying layer and charge-receiving layer is different from the junction as an object of the present invention. This means that no electric field gradient, or band bending, is formed in the thin film of the zinc oxide solid solution having a metallic property, instead a so-called Schottkey junction is formed at the junction between a metal and semiconductor.

Accordingly, the zinc oxide-based laminated structure should comprise the charge depletion layer formed in the charge-supplying layer due to charge transfer from the charge-supplying layer to the charge-receiving layer. While the donor concentration in the charge-supplying layer should be controlled depending on the extent of conductivity required for utilizing the zinc oxide-based laminated structure, it is desirable that the donor concentration in the charge-supplying layer does not exceed $10^{20}$ donors/cm$^3$.

When the thickness of the charge depletion layer formed in the charge-supplying layer is reduced, or when the height of the barrier at the interface is increased, charge separation may be imperfect. Accordingly, it is desirable for permitting charge separation perfect that the lattice volume Va of the charge-supplying layer is sufficiently smaller than the lattice volume Vb of the charge-receiving layer. The c-axis value of the lattice constant as a cause of change of the lattice volume, for example the c-axis value of the lattice constant of the charge-receiving layer, is desirably 0.0013 nanometer or more longer than the c-axis value of the lattice constant of the charge-supplying layer.

The configuration of the zinc oxide-based compound is not particularly specified in the zinc oxide laminated structure according to the present invention. However, when an element in which an electric current flows by allowing electrons transferred to the charge-receiving layer to run through the charge-receiving layer, or an electronic element such as a high electron mobility transistor that utilizes the charge-receiving layer as a channel layer as described in patent document 1, is formed, no scattering body that interferes with movement of electrons desirably exists in the charge-receiving layer.

When the charge-receiving material is polycrystalline, electron mobility may be decreased by the effect of electron scattering at grain boundaries of the polycrystalline structure. Consequently, a zinc oxide laminated structure having the charge-receiving layer with high electron mobility can be manufactured by using a zinc oxide single crystal as the charge-receiving layer.

The present invention also provides a zinc oxide laminated structure comprising two layers of a zinc oxide or zinc oxide solid solution layer with a lattice volume of Va and a donor concentration of Na, and a zinc oxide single crystal layer with a lattice volume of Vb and a donor concentration of Nb, wherein the relationships of Va<Vb and Na>Nb are satisfied between both layers of the laminated structures. The charge is transferred from the layer serving as the charge-supplying layer to the layer serving as the charge-receiving layer even when no external electric field is applied to the laminated structure; and a charge depletion layer is formed in the charge-supplying layer due to charge transfer from the charge-supplying layer to the charge-receiving layer.

The present invention also provides a zinc oxide laminated structure comprising two layers of a zinc oxide or zinc oxide solid solution layer with a lattice volume of Va and a donor concentration of Na, and a zinc oxide single crystal layer containing lithium with a lattice volume of Vb and a donor concentration of Nb, wherein the relationships of Va<Vb and Na>Nb are satisfied between both layers of the laminated structures. The charge is transferred from the layer serving as the charge-supplying layer to the layer serving as the charge-receiving layer even when no external electric field is applied to the laminated structure; and a charge depletion layer is formed in the charge-supplying layer due to charge transfer from the charge-supplying layer to the charge-receiving layer.

When the zinc oxide laminated structure is to be manufactured by a thin film synthesis process, residual carriers (electrons) may be formed in the charge-receiving layer due to non-stoichiometry of the layer. The residual carrier is formed by permitting non-stoichiometric defects such as oxygen defects to act as donors, and the Fermi level of the charge-receiving layer changes by the presence of the donor.

Both the band gap and Fermi level should be controlled for charge transfer according to the present invention, and the donor level caused by non-stoichiometry may be a cause of decreased controllability of the Fermi level. On the other hand, lithium causes field compensation between the donor and lithium when it is dissolved in zinc oxide by substituting a part of zinc, and works for decreasing the residual carrier concentration in zinc oxide. When one attempts to decrease the density of a shallow donor level in the charge-receiving layer to control the position of the Fermi level, a method for compensating the charge by adding lithium in the charge-receiving layer may be sometimes effective.

However, since lithium is an element having a large diffusion coefficient and being liable to be diffused in zinc oxide, it may decrease the electron density in the charge-supplying layer as a result of diffusion into the charge-supplying layer. Therefore, process control by taking diffusion of lithium into consideration is essential in the manufacturing process when the concentration of residual electrons in the charge-receiving layer is to be reduced by adding lithium.

The present invention provides a method for manufacturing a zinc oxide-based laminated structure comprising two layers of a zinc oxide or zinc oxide solid solution layer with a lattice volume of Va and a donor concentration of Na, and a zinc oxide or zinc oxide solid solution layer with a lattice volume of Vb and a donor concentration of Nb, wherein the relationships of Va<Vb and Na>Nb are satisfied between both layers of the laminated structures; and the layer with the lattice volume Va serves as a charge-supplying layer and the layer with the lattice volume Vb serves as a charge-receiving layer in the laminated structure. The charge is transferred from the layer serving as the charge-supplying layer to the layer serving as the charge-receiving layer even when no external electric field is applied to the laminated structure; and a charge depletion layer is formed in the charge-supplying layer due to charge transfer from the charge-supplying layer to the charge-receiving layer. The present invention also provides a method for manufacturing a zinc oxide laminated structure according to the method for manufacturing the zinc oxide-based laminated structure above, comprising two layers of a zinc oxide solid solution layer with a magnesium concentration of Ma, and a zinc oxide or zinc oxide solid solution layer with a magnesium concentration of Mb, wherein a layer with a magnesium concentration of Ma is formed at a temperature high enough for satisfying relationships of Va<Vb and Na>Nb between the two layers, when the lattice volume and donor concentration of the layer having the magnesium concentration of Ma are defined as Va and Na, respectively, and the lattice volume and donor concentration of the layer having the magnesium concentration of Mb are defined as Vb and Nb, respectively.

The lattice constant of zinc oxide can be reduced at an equilibrium state by allowing magnesium to replace zinc by dissolving into zinc oxide. However, in the zinc oxide-based laminated structure comprising a laminated layer of the charge-supplying layer and charge-receiving layer for inducing charge transfer as an object of the present invention, a donor element such as aluminum, or an intrinsic donor such as an oxygen defect as well as magnesium may be contained in the zinc oxide crystal.

When these additives as donors and defects are introduced, the lattice constant of zinc oxide may be larger than the lattice constant of pure zinc oxide, irrespective of addition of magnesium. This is a problem related to non-equilibrium of the manufacturing process, and is particularly liable to occur when the charge-supplying layer is formed in a highly non-equilibrium process.

The effect of adding magnesium is not evident depending on the manufacturing temperature even by adding magnesium, when the lattice constant exhibits the behavior as shown in FIG. 3. A zinc oxide-based compound having a larger lattice constant than that of pure zinc oxide may be obtained irrespective of the presence of magnesium.

When such problem occurs, the zinc oxide-based laminated structure should be manufactured in a state resembling to the equilibrium state by increasing the manufacturing temperature, wherein the temperature is high enough for obtaining a laminated structure having a smaller lattice constant of the charge-receiving layer than the lattice constant of the charge-supplying layer.

The present invention provides a method for manufacturing a zinc oxide-based laminated structure comprising two layers of a zinc oxide or zinc oxide solid solution layer with a lattice volume of Va and a donor concentration of Na, and a zinc oxide or zinc oxide solid solution layer with a lattice volume of Vb and a donor concentration of Nb, wherein the relationships of Va<Vb and Na>Nb are satisfied between both layers of the laminated structures; and the layer with the lattice volume Va serves as a charge-supplying layer and the layer with the lattice volume Vb serves as a charge-receiving layer in the laminated structure. The charge is transferred from the layer serving as the charge-supplying layer to the layer serving as the charge-receiving layer even when no external electric field is applied to the laminated structure; and a charge depletion layer is formed in the charge-supplying layer due to charge transfer from the charge-supplying layer to the charge-receiving layer. The present invention also provides a method for manufacturing a zinc oxide laminated structure according to the method for manufacturing the zinc oxide-based laminated structure above, comprising two layers of a zinc oxide solid solution layer with a magnesium concentration of Ma, and a zinc oxide or zinc oxide solid solution layer with a magnesium concentration of Mb, wherein a layer with a magnesium concentration of Ma is formed at a temperature high enough for satisfying relationships of Va<Vb and Na>Nb between the two layers, the lattice volume and donor concentration of the layer having the magnesium concentration of Ma are defined as Va and Na, respectively, and the lattice volume and donor concentration of the layer having the magnesium concentration of Mb are defined as Vb and Nb, respectively, and wherein the zinc oxide laminated structure is subjected to heat treatment at a temperature high enough for satisfying a relationship of Va<Vb when a laminated structure not satisfying the relationship of Va<Vb is manufactured immediately after an initial manufacturing process.

A laminated structure not satisfying the condition that the lattice volume of the layer serving as the charge-receiving layer is larger than the lattice volume of a layer serving as the charge-supplying layer may be obtained at the initial stage for forming the laminated structure due to a limitation of manufacturing facilities when the zinc oxide-based laminated structure is manufactured.

The electronic state as shown in FIG. 1 is not satisfied in such case. It is generally considered that many defects are introduced due to high non-equilibrium in the manufacturing process of the laminated structure as shown in FIG. 3, and the desired lattice constant cannot be obtained. Therefore, the defect contained in the laminated structure is recovered by applying a post-heat treatment after forming the laminated structure, so that the lattice constant of the charge-supplying layer as an object of the present invention is smaller than the lattice constant of the charge-receiving layer.

EXAMPLE

Example 1

A zinc oxide-based laminated structure was manufactured by laminating zinc oxide solid solution layer, doped with 15 at % of magnesium and 0.1 at % of aluminum, at a thickness of about 500 nm on the polished surface of a zinc single crystal (lattice constant of c-axis is 0.5207 nm) substrate with a thickness of 0.5 mm manufactured by a chemical vapor transport method without any additives. The donor concentration in the zinc oxide single crystal was about $10^{17}$ donors/cm$^3$, and the donor concentration in the layer doped with magnesium and aluminum was about $10^{19}$ donors/cm$^3$.

The c-axis length of the lattice constant of the zinc oxide layer doped with magnesium and aluminum was 0.5192 nm, while the c-axis length of the lattice constant of the zinc oxide single crystal was 0.5207 nm. Since both layers are in an epitaxial relation one another, the length of the a-axis is the same for both layers within an accuracy of measurement.

The difference of the length of the c-axis between the two layers causes a different of the lattice volume, and the lattice volume of the layer doped with aluminum and magnesium is smaller than the lattice volume of the pure zinc oxide single crystal layer. A pair of electrodes as indicated by a reference numeral 1 was formed on both surfaces of the laminated structure comprising zinc oxide solid solution layer 2, in which aluminum and magnesium are dissolved, and a zinc oxide single crystal layer 3 as shown in the inserted drawing in FIG. 4. The curve shown in FIG. 4 was obtained by measuring current-voltage characteristics by connecting a direct current source and an ammeter to the electrodes.

A change of the electrostatic capacity dependent on the applied bias voltage was observed by measuring the applied bias voltage dependency of the electrostatic capacity at the interface of the laminated structure, and charge depletion layers were confirmed to be formed in the layer doped with aluminum and magnesium. This means that charge transfer occurred from the zinc oxide layer doped with the donors to the non-doped zinc oxide layer by doping the zinc oxide having a smaller lattice constant with the donor and by laminating the doped zinc oxide with the non-doped zinc oxide to cause charge separation.

Example 2

A laminated structure was manufactured by depositing a zinc oxide solid solution thin film with a thickness of about 500 nm, which was doped with 15 at % of magnesium and 0.1 at % of aluminum, on a zinc oxide single crystal substrate with a thickness of 0.5 mm, which is synthesized by a hydrothermal method and contains about 10 ppm of lithium, at 600° C. by a pulse laser vapor deposition method. The donor concentration in the zinc oxide single crystal layer was about $10^{14}$ donors/cm$^3$, while the donor concentration in the zinc oxide solid solution layer was about $10^{19}$ donors/cm$^3$.

The c-axis length of the zinc oxide thin film containing aluminum and magnesium is about 0.5192 nm as in Example 1 above, while the c-axis length of the lattice constant of the zinc oxide thin film layer is 0.5207 nm. Since both layers are in an epitaxial relation, the axis length of both layers is the same within the accuracy of measurement. Since the difference of the c-axis length between the two layers causes a difference in the lattice volume, the lattice volume of the layer doped with aluminum and magnesium is smaller than the lattice volume of the pure zinc oxide single crystal layer.

Bias voltage dependency of the electrostatic capacity that indicates formation of a charge deletion layer was observed as in FIG. 1 from the measurement of bias dependency of the electrostatic capacity by disposing the electrodes as shown in Example 1. This shows that the laminated structure obtained in this example has a charge separation structure in which electron were transferred from the zinc oxide solid solution layer containing aluminum and magnesium and having a smaller lattice constant to the zinc oxide single crystal layer containing lithium.

Example 3

A zinc oxide solid solution thin layer containing 15 at % of magnesium and 0.1 at % of aluminum was deposited by a pulse laser vapor deposition method at a thickness of about 500 nm at a crystal growth temperature of 400° C. on a zinc oxide single crystal substrate containing no additives. The donor concentration in the zinc oxide single crystal layer was about $10^{14}$ donors/cm$^3$, while the donor concentration in the zinc oxide solid solution layer doped with aluminum and magnesium was about $10^{19}$ donors/cm$^3$.

The lattice constant of the deposited zinc oxide solid solution thin film was measured, and it was fond that the c-axis length of the thin film was about 0.522 nm that is larger than the c-axis length of the zinc oxide single crystal used as a substrate. This means the lattice constant of the zinc oxide single crystal is the same as the a-axis lattice constant of the zinc oxide solid solution thin film doped with aluminum and magnesium within a range of accuracy of measurement. Since the c-axis lattice constant of the zinc oxide single crystal is 0.5207 nm, the lattice volume of the zinc oxide solid solution thin layer doped with aluminum and magnesium is larger than the lattice volume of the zinc oxide single crystal.

The result of the measurement of the zinc oxide-based laminated structure thus obtained showed, different from the result in FIG. 4, current-voltage characteristics according to Ohm's law without any rectifying property. This shows that the relation between the band gap and Fermi level is inappropriate for inducing charge separation, because the lattice constant of the zinc oxide solid solution layer doped with magnesium and aluminum that should naturally has a smaller lattice constant was rather increased.

The zinc oxide-based laminated structure exhibiting no charge separation was heat treated at 1000° C. for 2 hours. No changes were observed in the lattice constant of the ZnO single crystal containing no additives, while the lattice constant of the zinc oxide solid solution thin film layer doped with aluminum and magnesium was reduced from 0.5220 nm to 0.5194 nm. This means that the defect contained immediately after depositing the zinc oxide solid solution thin film was extinguished by the heat treatment, and the lattice volume was reduced as an effect of addition of magnesium.

Non-linear current-voltage characteristics as shown in FIG. 3 were obtained from the current-voltage measurement of the zinc oxide-based laminated structure after the heat treatment. The same bias voltage dependency of the electrostatic capacity as that in FIG. 4 was confirmed, and it was concluded that a zinc oxide laminated structure containing a charge separation state was manufactured.

Comparative Example 1

The zinc oxide based laminated structure was manufactured by the same manufacturing method as in Example 2, except that the concentrations of the magnesium and aluminum of the thin film deposited by the pulse laser vapor deposition method were 5 at % and 1 at %, respectively. No decrease of the lattice volume in the laminated structure due to addition of magnesium was observed, and the c-axis length of the lattice constant of the zinc oxide solid solution layer containing magnesium and aluminum was 0.5217 nm, which was larger than the lattice constant of the zinc oxide layer containing no additives.

With respect to the donor concentration, the donor concentration of the layer doped with aluminum and magnesium was about $10^{20}$ donors/cm$^3$. This means that, while the condition of the present invention is satisfied since the layer doped with aluminum and magnesium has a larger donor concentration, the lattice volume of the layer doped with aluminum and magnesium is larger with respect to the lattice volume, or in the relation of the lattice constants, and the laminated structure of this example does not satisfy the essential condition of the present invention.

No non-linearity was observed in the current-voltage characteristics of the laminated structure, which shows that no interface barrier due to charge separation was formed. The zinc oxide-based laminated structure obtained in this example cannot be recognized as the example according to the present invention.

INDUSTRIAL APPLICABILITY

The present invention provide a zinc oxide laminated structure exhibiting a charge separation state by laminating a charge supplying layer and charge receiving layer, wherein the laminated structure comprises zinc element relatively abundant in underground resources, and uses a semiconductor material of zinc oxide that is rather cheaply manufactured and sold. The zinc oxide laminated structure of the present invention is useful in optical, electric and electronic industrial fields.

Figure 1:
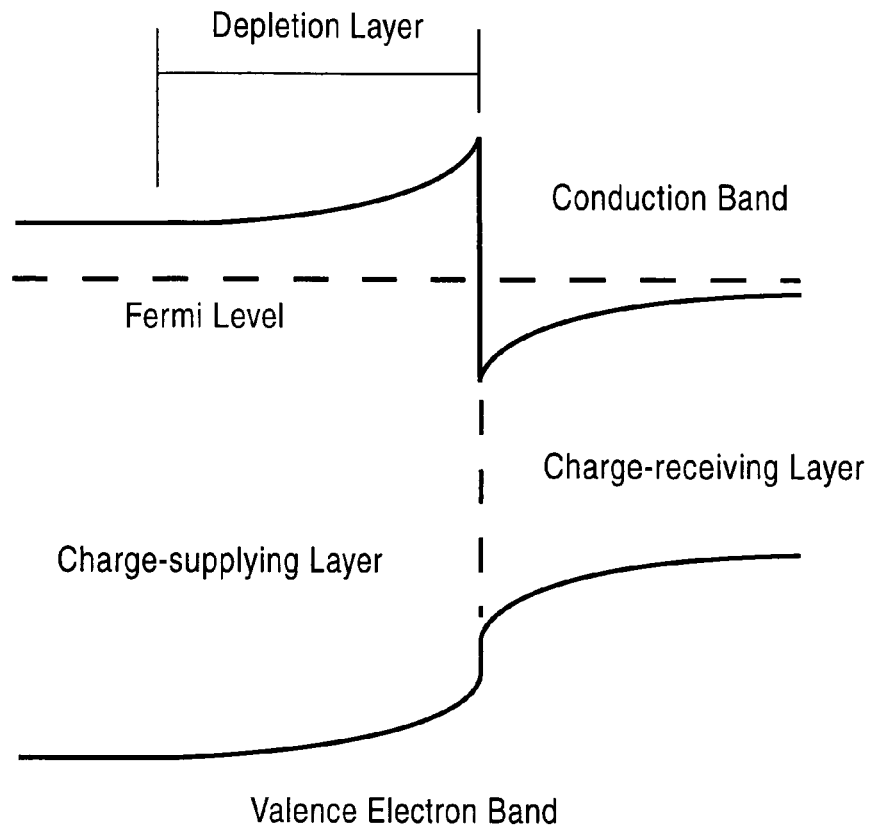
FIG. 1 is a schematic illustration of the electron state in the vicinity of the interface of lamination between the laminated structures of zinc oxide that serve as the charge-receiving layer and charge-supplying layer, respectively.
Figure 2:
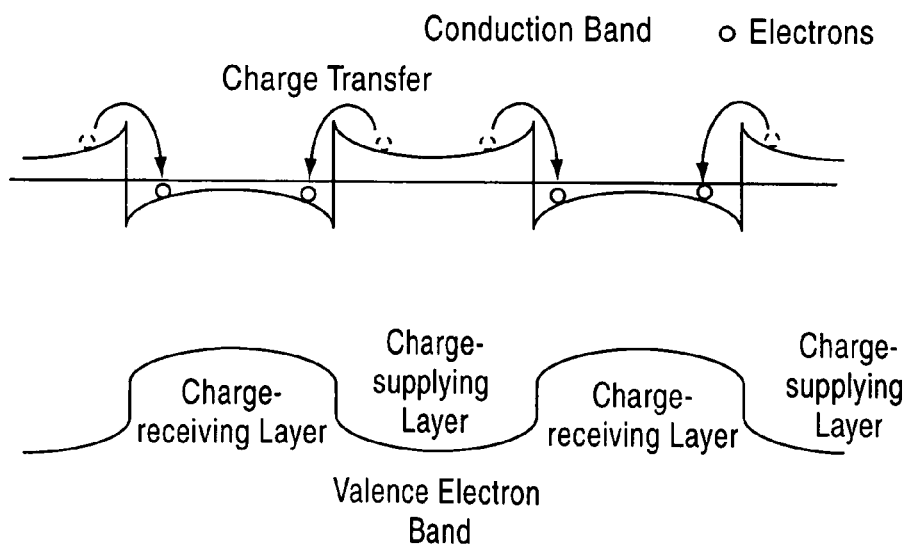
FIG. 2 is a schematic drawing of the laminated body of zinc oxide after modulated doping prepared by alternately laminating a plurality of charge-receiving layers and charge-supplying layers.
Figure 3:
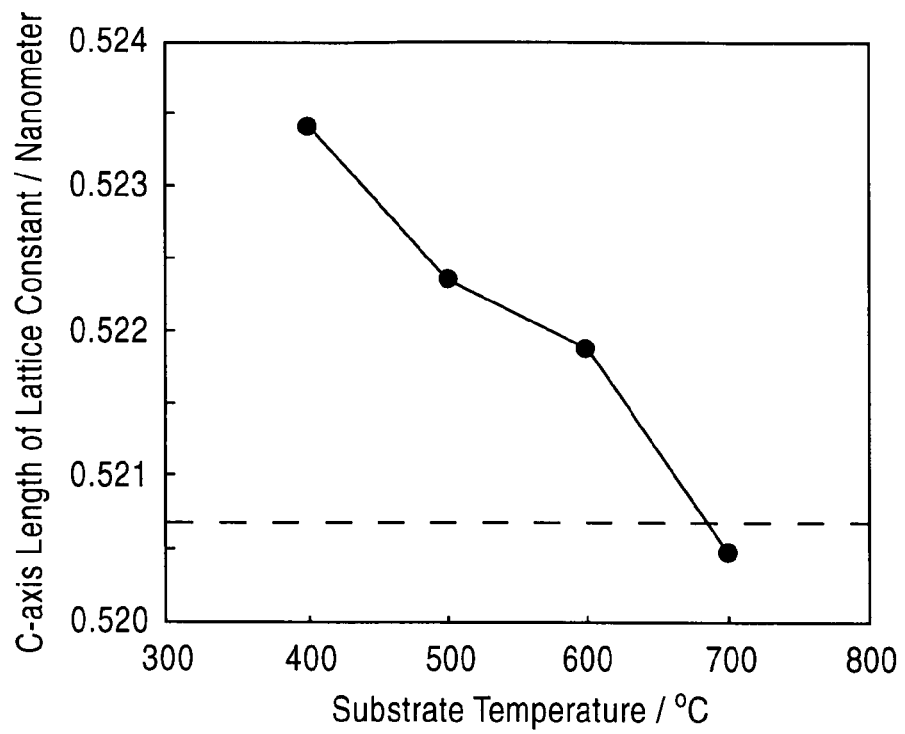
FIG. 3 is a graph showing the relation between the lattice constant of the zinc oxide crystal, which is manufactured by a pulse laser deposition method, constituting the thin layer of zinc oxide in which aluminum is added in a concentration of 0.5 at %, and the growth temperature for manufacturing the thin layer.
Figure 4:
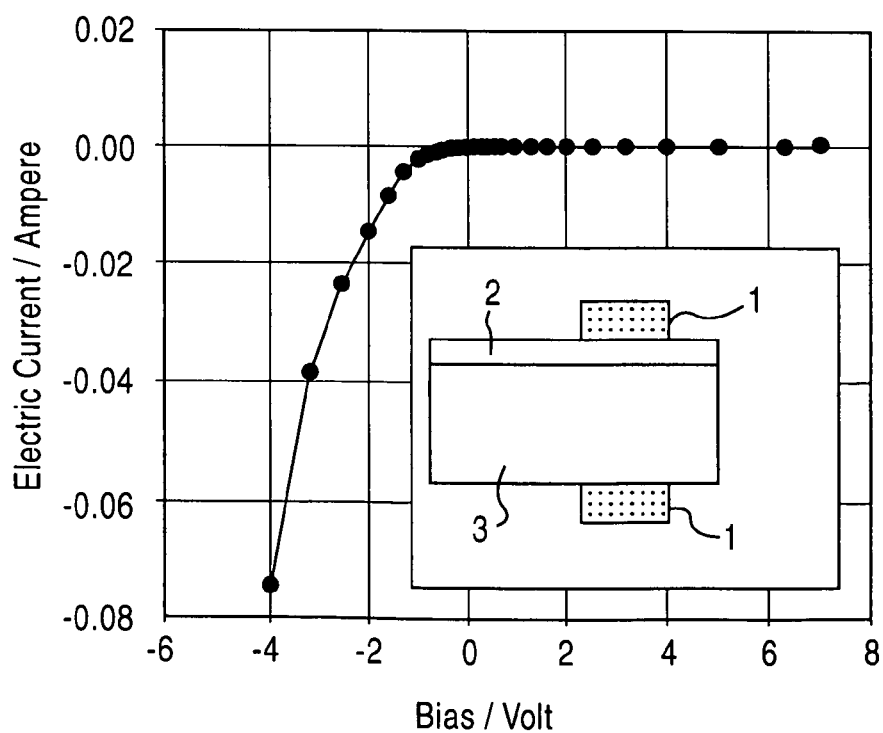
FIG. 4 is a graph showing current-voltage characteristics in the laminated structure prepared by depositing the zinc oxide thin layer doped with magnesium and aluminum on the zinc oxide single crystal synthesized by a chemical vapor phase transport method.
Figure 5:
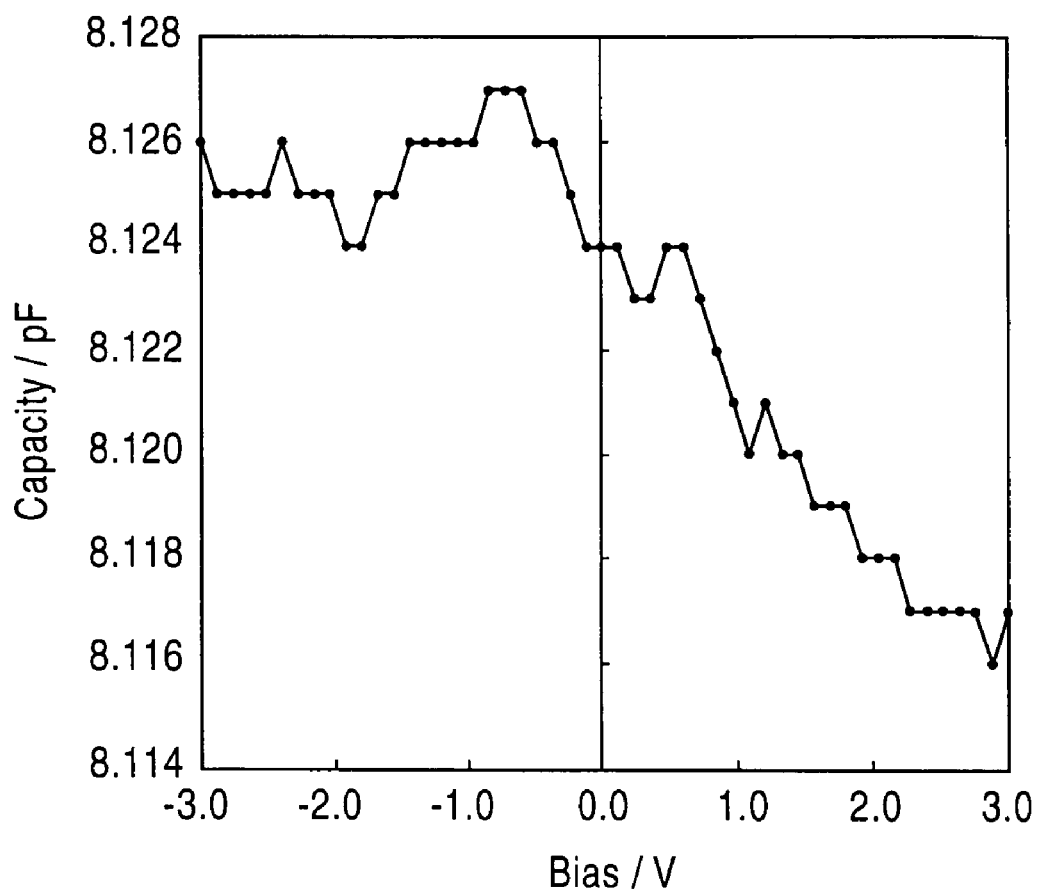
FIG. 5 is a graph showing bias voltage dependency of electrostatic capacity in the laminated structure prepared by depositing the zinc oxide thin layer doped with magnesium and aluminum on the zinc oxide single crystal synthesized by a hydrothermal method and containing lithium.

The invention claimed is:

1. A zinc oxide laminated structure comprising:
a zinc oxide solid solution layer containing magnesium, said zinc oxide solid solution layer having a lattice volume of Va and donor concentration of Na, wherein the donor in the zinc oxide solid solution layer comprises one or more selected from the group consisting of aluminum, gallium, indium, hydrogen and oxygen defect; and
a zinc oxide single crystal layer with a lattice volume of Vb and donor concentration of Nb, wherein the donor in the zinc oxide single crystal layer comprises lithium,
wherein the relationships of Va<Vb and Na>Nb are satisfied between the zinc oxide solid solution layer and the zinc oxide single crystal layer of the zinc oxide laminated structure, and
charge separation has occurred in the zinc oxide laminated structure.

2. A method for manufacturing a zinc oxide-based laminated structure of claim 1, comprising:
forming a laminated structure comprising a zinc oxide solid solution layer with a lattice volume of Va and donor concentration of Na, and a zinc oxide single crystal layer with a lattice volume of Vb and donor concentration of Nb,
wherein the zinc oxide solid solution layer is formed under a nonequilibrium state at a high temperature enough for satisfying the relationships of Va<Vb and Na>Nb between the zinc oxide solid solution layer and the zinc oxide single crystal layer.

3. A method for manufacturing a zinc oxide laminated structure of claim 1, comprising:
forming a laminated structure comprising a zinc oxide solid solution layer with a lattice constant of Va and donor concentration of Na, and a zinc oxide single crystal layer with a lattice volume of Vb and donor concentration of Nb; and
heat treating the laminated structure so that a relationship of Va<Vb is satisfied between the zinc oxide solid solution layer and the zinc oxide single crystal layer when the laminated structure obtained does not satisfy a relationship of Va<Vb.

* * * * *